US009018705B2

(12) United States Patent
Hwang (10) Patent No.: US 9,018,705 B2
(45) Date of Patent: Apr. 28, 2015

(54) ESD TRANSISTOR

(71) Applicant: MagnaChip Semiconductor, Ltd., Cheongju-si (KR)

(72) Inventor: Kyong Jin Hwang, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/166,378

(22) Filed: Jan. 28, 2014

(65) Prior Publication Data

US 2014/0353799 A1  Dec. 4, 2014

(30) Foreign Application Priority Data

May 31, 2013  (KR) ........................ 10-2013-0062781

(51) Int. Cl.
 *H01L 23/62* (2006.01)
 *H01L 29/00* (2006.01)
 *H01L 21/331* (2006.01)
 *H01L 29/73* (2006.01)

(52) U.S. Cl.
 CPC ..................... *H01L 29/73* (2013.01)

(58) Field of Classification Search
 CPC ............ H01L 27/0266; H01L 27/0255; H01L 27/0251; H01L 29/0692; H01L 29/735; H01L 21/822; H01L 21/00; H01L 27/0658; H01L 29/00; H01L 29/73
 USPC .......... 257/355, 358, 560, 561, 564; 438/329, 438/338, 342
 See application file for complete search history.

(56) References Cited

U.S. PATENT DOCUMENTS

| | | | |
|---|---|---|---|
| 6,844,597 B2 | 1/2005 | Baird et al. | |
| 2007/0284665 A1* | 12/2007 | Nagai | 257/357 |
| 2011/0254120 A1* | 10/2011 | Imahashi | 257/526 |
| 2013/0279051 A1* | 10/2013 | Gill et al. | 361/56 |

* cited by examiner

*Primary Examiner* — Hsien Ming Lee
(74) *Attorney, Agent, or Firm* — NSIP Law (57) ABSTRACT

An ESD transistor is provided. The ESD transistor includes a collector region on a substrate, a base contact region on the substrate, an emitter region spaced apart from the base contact region, a sink region disposed vertically below the collector region, and a buried layer disposed horizontally under the sink region.

21 Claims, 7 Drawing Sheets

ESD TRANSISTOR

CROSS-REFERENCE TO RELATED APPLICATION

This application claims the benefit under 35 USC 119(a) to Korean Patent Application No. 10-2013-0062781 filed on May 31, 2013, in the Korean Intellectual Property Office, the entire disclosure of which is incorporated herein by reference for all purposes.

BACKGROUND

1. Field

The present description relates to an ESD transistor and to an ESD transistor for high voltage applications that can shunt ESD current at a high level while reducing clamping voltage by forming an extended current path in the ESD transistor.

2. Description of Related Art

Electrostatic discharge (hereafter, referred to as "ESD") is very important for reliability of most integrated circuits or core circuits. Circuit designers can protect a core circuit by implementing an ESD protection circuit connected with an I/O pad and connected to a ground GND, using an ESD transistor that is connected with the core circuit in parallel.

Figure 1:
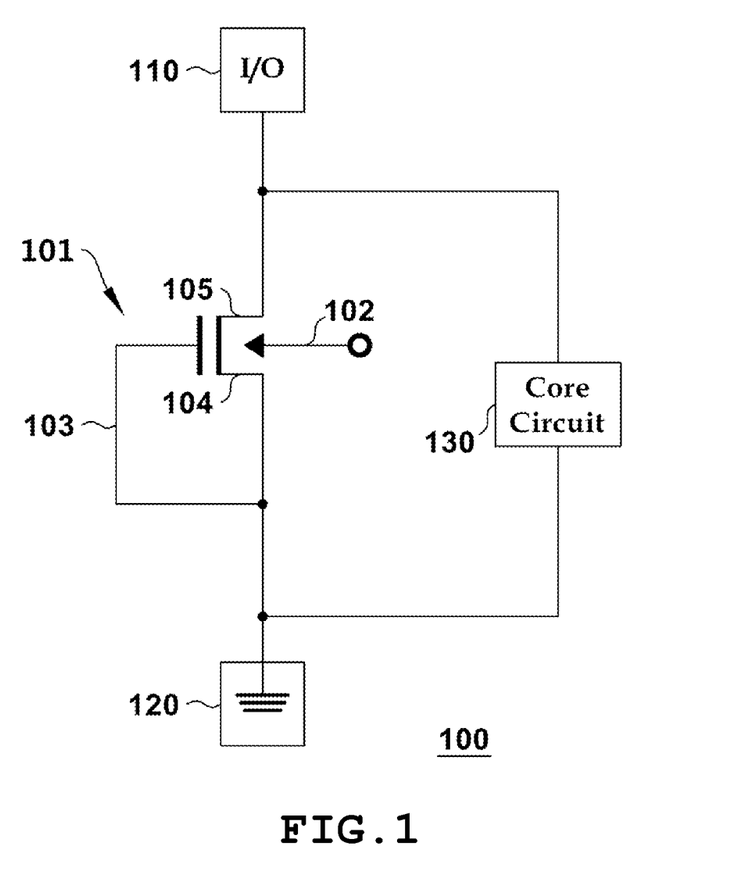
FIG. 1 is a block diagram illustrating an ESD protection circuit.

FIG. 1 is a block diagram illustrating an ESD protection circuit.

Referring to FIG. 1, an ESD protection circuit includes a floating-body transistor 101 (or clamp) that includes a body 102, a gate 103, the source 104, and the drain 105. The ESD protection circuit connects to an I/O pad 110 through the drain 105 of the floating-body transistor 101 and to a ground 120 through the source 104 of the floating-body transistor 101. The gate 103 of the floating-body transistor 101 is connected to the source 104, and a core circuit 130 is connected to the drain 105 and the source 104 in parallel with the floating-body transistor 101.

However, the ESD protection circuit with the illustrated configuration may exhibit difficulties in shunting high-level ESD currents while maintaining low clamping voltages. For example, in a transistor using high voltage over 20V, the doping concentration in the source 104 and the drain 105 should be low in order to maintain high break down voltage in the ESD protection circuit. However, during an event of electric discharge, the ability of the ESD protection circuit to protect the core circuit 130 decreases due to the high turn-on voltage induced in the operation of a GGNMOS and a bipolar junction transistor (BJT). Even in the event that the ESD protection circuit is turned on, strong snapback results due to a kirk effect in a high current bipolar operation mode.

In turn, the high turn-on voltage and the strong snapback may result in the generation of interface current and a change of BJT turn-on voltage due to a damage that may occur around a field insulating film (or a field oxide film) that exists between a drift doping region and a N+ doping region of the floating-body transistor 101.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an ESD transistor including: a collector region on a substrate; a base contact region on the substrate; an emitter region spaced apart from the base contact region; a sink region disposed vertically below the collector region; and a buried layer disposed horizontally under the sink region.

The buried layer may horizontally extend under both the sink region and the emitter region.

At least two collector regions, base contact regions, and sink regions may be respectively symmetrically disposed at both sides of the emitter region, and the N-buried layer may extend to connect the lower ends of the two sink regions at both sides of the emitter region.

The base contact region may include one or more counter-doping regions doped with a dopant of a conductivity type different from a dopant of the base contact region.

The general aspect of the ESD transistor may further include a tap region disposed adjacent to the collector region.

The general aspect of the ESD transistor may further include an N-well region disposed between the tap region and the buried layer.

The general aspect of the ESD transistor may further include a P-well region disposed in contact with the N-well region under the tap region.

The general aspect of the ESD transistor may further include: a first insulating film disposed between the emitter region and the base contact region; and a second insulating film disposed between the base contact region and the collector region.

The general aspect of the ESD transistor may further include a base region surrounding the emitter region and the base contact region.

The collector region, the base contact region, and the emitter region may each include corners.

The horizontal distance between the base region and the sink region may be larger than the vertical distance between the base region and the buried layer.

The base region may further include at least one additional doping region surrounding the base region.

The horizontal distance of the second insulator film may be larger than the vertical distance between the base region and the buried layer.

The ESD transistor may be configured so that stress applied passes the collector region, the buried layer, and the emitter region in that order.

The general aspect of the ESD transistor may further include a resistor connected between an emitter electrode disposed on the emitter region and a base electrode disposed on the base contact region.

The ESD transistor may be a bipolar junction transistor.

The general aspect of the ESD transistor may further include a diode that includes the P-well and the N-well.

In another general aspect, there is provided an ESD transistor including: an N-type well disposed on a substrate; a P-well disposed in contact with the N-well; a collector region, a base region, and an emitter region disposed on a surface of the substrate; a resistor connecting the emitter region and the base region; and a diode connecting the P-type well and the N-type well.

The resistor may include poly-silicon.

The general aspect of the ESD transistor may further include a buried layer connected with the collector region.

The ESD transistor may be configured so that stress applied passes the collector region, the buried layer, and the emitter region in that order.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "under", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof. With an ESD protection device, the capacity to shunt high-level ESD current while providing low clamping voltage can better protect the inner circuits, resulting in a reliable electronic product.

Figure 2A:
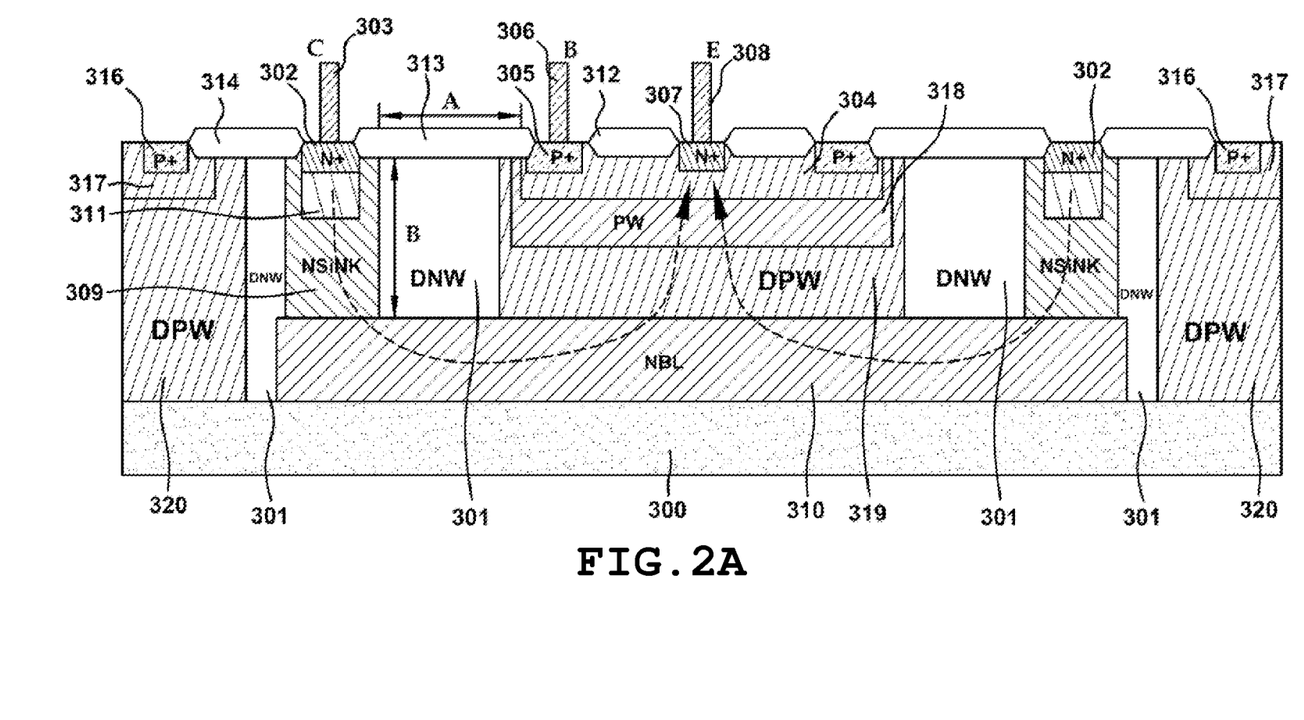
FIG. 2A is a cross-sectional view illustrating an example of an ESD transistor according to the present disclosure.
Figure 2B:
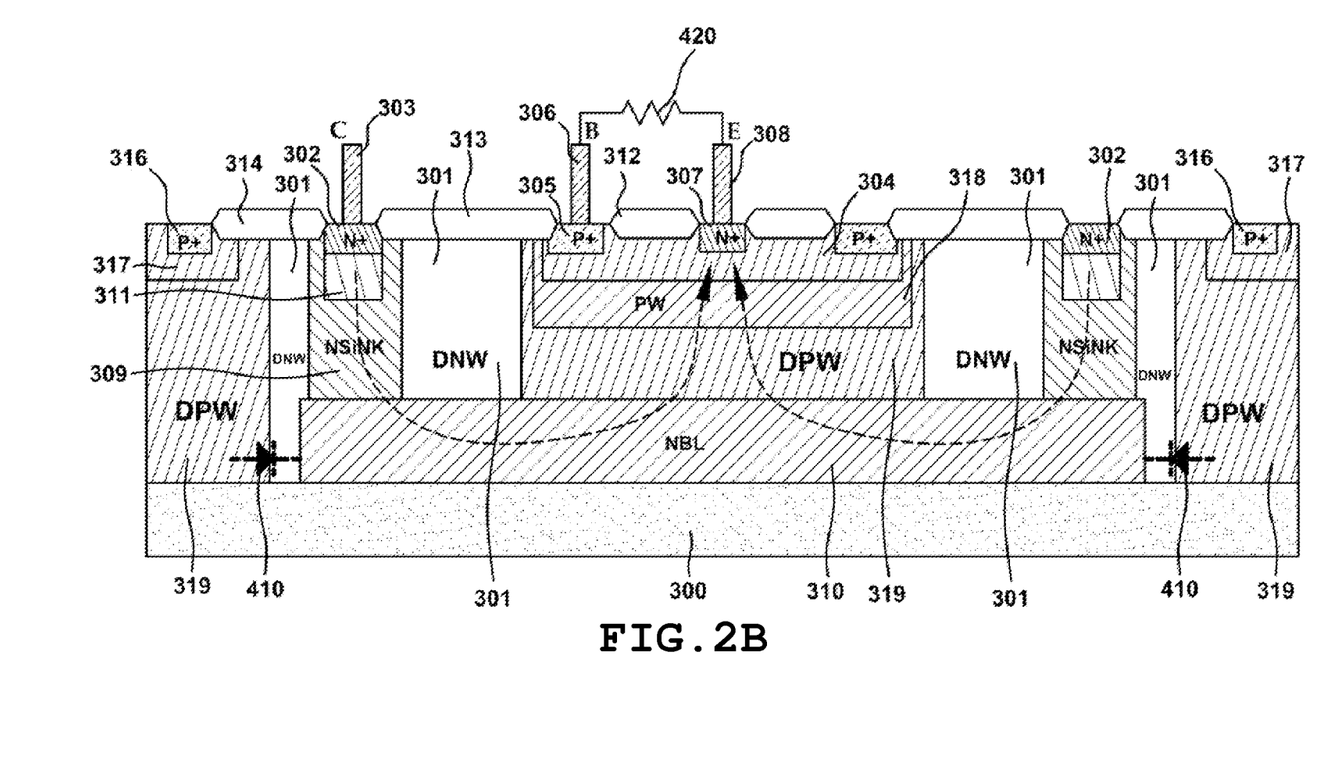
FIG. 2B is a cross-sectional view illustrating another example of an ESD transistor.
Figure 3:
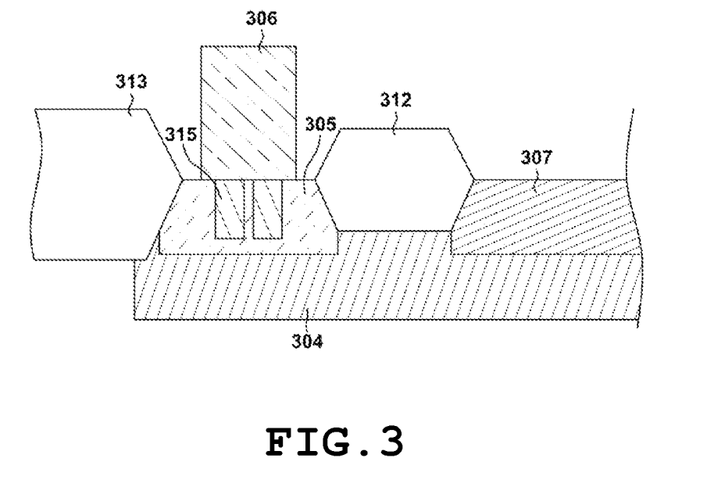
FIG. 3 is a cross-sectional view illustrating a magnified view of the base contact region and the insulating film of the ESD transistors illustrated in FIGS. 2A and 2B.
Figure 4:
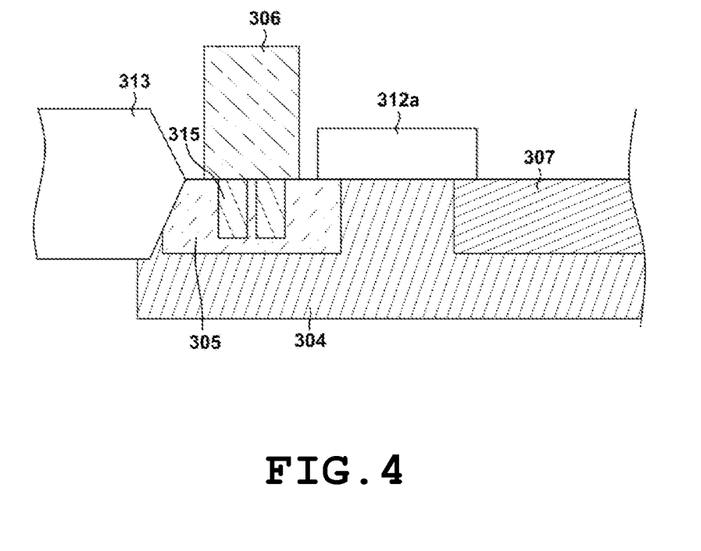
FIG. 4 is a cross-sectional view illustrating a magnified view of the base contact region and the insulating film of FIGS. 2A and 2B.
Figure 5:
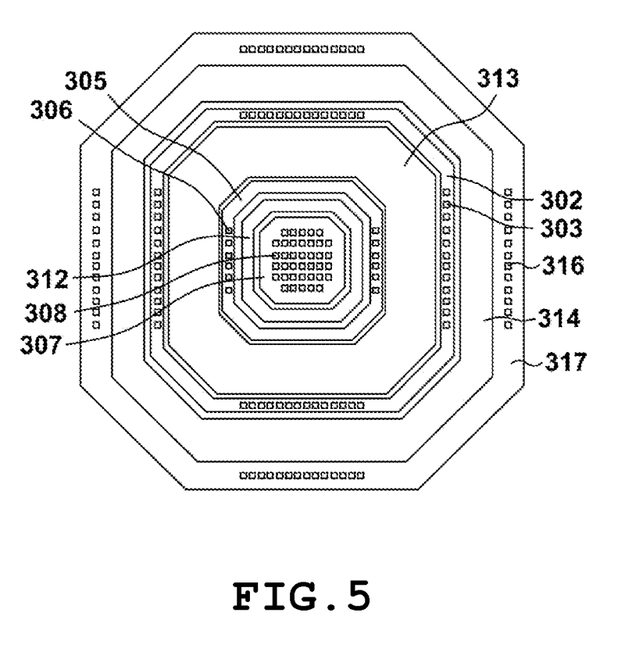
FIG. 5 is a plan view of an ESD transistor for high voltage according to the examples illustrated in FIGS. 2A and 2B.

FIGS. 2A and 2B are cross-sectional views illustrating examples of ESD transistors according to the present disclosure. FIGS. 3 and 4 are cross-sectional views illustrating in detail various examples of the base contact region and the insulating film of FIGS. 2A and 2B. FIG. 5 is a plan view of an example of an ESD transistor according to FIGS. 2A and 2B.

As illustrated in FIGS. 2A and 2B, an example of an ESD transistor for high voltage applications includes a silicon substrate 300, an N-well region (DNW; Deep N-Well) 301, an N+ collector region 302, a P-type base region 304, a P+ base contact region 305, an N+ emitter region 307 spaced from the base contact region 305, and an N-type sink region 309 and an N-type buried layer 310 that are vertically arranged downward under the N+ collector 302. The ESD transistor for high voltage according to the present disclosure is BJTs that are formed by connecting the N-type buried layer 310 and the collector region 302 to the N-type sink region 309, and then forming an N-type emitter junction on the P-type base region 304.

The base contact region 305 is provided for forming ohmic contact resistance between the base electrode 306 and the P-type base region 304 by implanting P+ ions with high concentration in order to reduce resistance when voltage is applied to the P-type base region 304. The dopant concentration in the P-type base region 304 may be lower than the dopant concentration in the base contact region 305.

The N-type buried layer 310 extends horizontally to interconnect the lower ends of the N-type sink regions 309 formed at both sides of the base region 304. In one example, the buried layer 310 may be spaced at about 2~20 μm from the top surface of the substrate 300.

The N-type sink region 309 is a region highly doped with an N-type substance in ion implantation.

The doping concentrations of the N-type buried layer 310 and the N-type sink region 309 may be $10^{19}/cm^3$ or more. That is, it is possible to set the dopant concentration of the N-buried layer 310 at $1.5 \times 10^{19}$ to $1.9 \times 10^{19}$ atoms/$cm^3$ so that a constant breakdown voltage BV can be maintained between the collector C and the base B or the collector C and the emitter E. For this configuration, an N-type doped emitter region 307 is formed in the P-type base region 304.

Accordingly, as illustrated in FIG. 2A, the path of the stress current applied to the collector region 302 forms a U-shaped path toward the emitter 307 through the base region 304 after passing through the vertically formed N-type sink region 309 and the horizontally arranged N-type buried layer 310, such that a relatively long current path is maintained inside the ESD transistor (see the dotted line in FIG. 2A).

In this example, because the thermal breakdown current and voltage increases during an inflow of stress current due to the extended current path formed in the ESD transistor for high voltage over 20V, it is possible to reduce the clamping voltage and shunt the high-level ESD current effectively.

An N-type collector expansion region 311 may be further provided under the collector region 302. The collector expansion region 311 serves to further extend the collector region 302 vertically downward.

The ESD transistor further includes a first insulating film 312 formed between the emitter region 307 and the base contact region 305, and a second insulating layer 313 formed between the base contact region 305 and the collector region 302.

The horizontal distance A between the base region 304 and the N-type sink region 309 may be at least 1.2 times the vertical distance B between the base region 304 and the buried layer 310. Alternatively, the horizontal distance of the second insulating film 313 may be at least 1.2 times the vertical distance B between the base region 304 and the buried layer 310, that is, over the horizontal distance A. This is because when stress current flows to the collector electrode 302 and a current path between the base electrode 305 and the collector electrode 302 is formed on the surface under the second insulting film 313, thermal breakdown may be generated early and a failure may be generated at a low voltage level.

Accordingly, in this example, the horizontal distance A between the base region 304 and the N-type sink region 309 or the horizontal distance of the second insulating film 313 is made at least 1.2 times larger than the vertical distance B between the base region 304 and the buried layer 310, in order to prevent a lateral current path from being generated on the bottom of the second insulating film 313 in response to an inflow of ESD stress. Therefore, the breakdown voltage may be stably generated early in response to an inflow of the ESD stress.

The P-type base region 304 is structured to surround both of the emitter region 307 and the base contact region 305.

That is, the base region 304 may be formed in a BJT by horizontally and vertically completely surrounding and isolating the N-type emitter region 307 from the collector region 302. To this end, the depth of the base region 304 may be set at 1~10 μm. The P-type base region 304 may further include one or more additional doping regions 318 and 319 surrounding the base region 304.

The additional doping regions 318 and 319 may be formed in a P-well (PW) or a high-voltage P-well (DPW, Deep P-Well).

To appropriately adjust the breakdown voltage BV between high-voltage N-wells (deep N-well, DNW) adjacent to the PW, in this example, the additional P-well is formed in the additional doping regions 318 and 319. The BV between the high-voltage N-wells (Deep N-well, DNW) is changed according to the concentration of the P-well, so desired BV can be obtained from an appropriate ion implantation concentration in forming of the P-well. Thus, the degree of freedom of the device performance can be increased.

Further, a tap region 316 that is spaced from the collector region 302 by a third insulating film 314 and highly doped in P-type is further included and a PW region 317 may be further included under the tap region 316. The P+ tap region is needed for applying ground voltage or negative voltage to the substrate. The first to third insulating films 312, 313 and 314 are formed by a LOCOS process in this example; however, in other examples, the insulating films 312, 313 and 314 may be formed by using a STI process.

As shown in FIG. 2B, a resistor 420 is connected between the emitter electrode 308 and the base electrode 306. The resistor has a resistance in the range of 10~500 KΩ, and may be made of poly-silicon or a metal. In one example, poly-silicon is used to form the resistor because poly-silicon may be easily adjusted to obtain the desired resistance. The use of poly-silicon may increase efficiency of an ESD transistor when a bipolar junction is formed. The ESD transistor for high voltage according to the present disclosure may be a bipolar junction transistor (BJT). The resistor 420 serves to adjust the potential between the base B and the emitter E. That is, it provides fast turn-on voltage by increasing the base potential. Accordingly, it is possible to achieve a stable BJT feature when positive stress is applied to the collector C.

Accordingly, it is possible to reduce the ESD stress immunity level by individually using the resistor 420. Thus, in this example, a specific diode 410 is disposed in parallel with the external resistor 420, such that more stable ESD protection circuit may be obtained.

In one example, as the diode 410 is disposed in parallel with the resistor 420 of the transistor, more stable ESD transistor for high voltage can be obtained. Referring to FIG. 2B, the P+ tap region 316 is formed on the substrate 300 and the P-well region (DPW) 320 adjacent to the N-well region (DNW) 301 is formed under the tap region 316. A PN diode 410 may be formed by bringing the P-well region 320 and the N-well region 301 in contact with each other. The N-well region 301 may be disposed between the tap region 316 and the buried layer 310 or between the tap region 316, and the collector region 302 and the sink region 309 to separate the EST transistor that is a BJT and the P+ tap region 316.

The diode 410 of the ESD transistor can prevent reduction of the ESD stress immunity level due to individual use of the resistor 420. Further, the diode 410 may facilitate securing a stable BJT feature when stress is applied to the ground region, in which the stress in the ground region is allowed to move out to the I/O pad through the forward PN diode 410. The stress cannot move out through the ESD device, which is a BJT, such that an additional diode is needed.

As shown in FIGS. 3 and 4, first insulating films 312 and 312a are formed to prevent short of the base contact region 305 and the emitter region 307 due to a silicide process, when an EST protection BJT is formed. The first insulating films may be silicon oxide films or silicon nitride films.

Referring to FIG. 3, a first insulating film 312 may be a film formed by a LOCOS (Local Oxidation of Silicon) process or an STI separation film. Further, referring to FIG. 4, the first insulating film 312a may be formed on the surface and this change may be selectively used in accordance with various manufacturing processes.

Further, as illustrated in FIG. 3, the base contact region 305 includes one or more counter-doping regions 315 that are doped in a conductive type different from the base contact region 305 at a portion therein.

That is, by performing counter doping with N-type conductor on one or more N-type counter-doping regions 315 at a portion of the P+ base contact region 305, resistance is increased between the P+ base contact region 305 and the N+ emitter region 307.

As described above, counter doping may be performed simultaneously on some regions of the base contact region 305, using an N+ doping process for forming the N+ emitter region 307 or the N+ collector region 302 without using a separate process when performing the counter doping to increase resistance.

Accordingly, by separately forming the N-type doping regions 315 at two or more positions in the P+ base contact region 305, the N-type dopant is diffused in accordance with the number of the N-doping regions, such that the resistance of the P+ base contact region 305 can be adjusted. When the gap between the counter-doping regions 315 is large, the resistance of the P+ base contact region 305 decreases, whereas when the gap is small, the resistance of the P+ base contact region 305 increases, such that the features of the ESD protection device can be adjusted in accordance with the gap distance.

By adjusting the resistance of the transistor, for instance the resistance of a BJT device, it is possible to achieve a fast turn-on voltage by rapidly increasing the potential of the base in response to an inflow of stress current. As described above, a specific resistor is not needed to be added at the outside, such that it can contribute to a reduction of the size of the device.

Further, referring to FIG. 5, in the ESD transistor for high voltage according to one example, the collector region 302, the base contact region 305, and the emitter region 307 each may be formed in an octagon shape in the plan view with a horizontal cross-sectional having edges. In other words, the angles are obtuse angles, rather than 90 degree angles.

Accordingly, while the horizontal cross-sections of the collector region 302, the base contact region 305, and the emitter region 307 include corners, for instance for silicon, the corners substantially make an ellipse shape or a rounded curve, and there are no pointed corners. Therefore, it is possible to prevent failure that may result from generating at a low voltage level due to the concentration of the electric field at sharp corners of the structure.

To this end, the cross-sectional area of the emitter region 307 may be set to 10 $\mu m^2$ or more to correspond to ESD stress, and the cross-sectional areas of the collector region 302 and the tap region 317 may be set at least 1.2 times the cross-sectional area of the emitter region 307.

Figure 6:
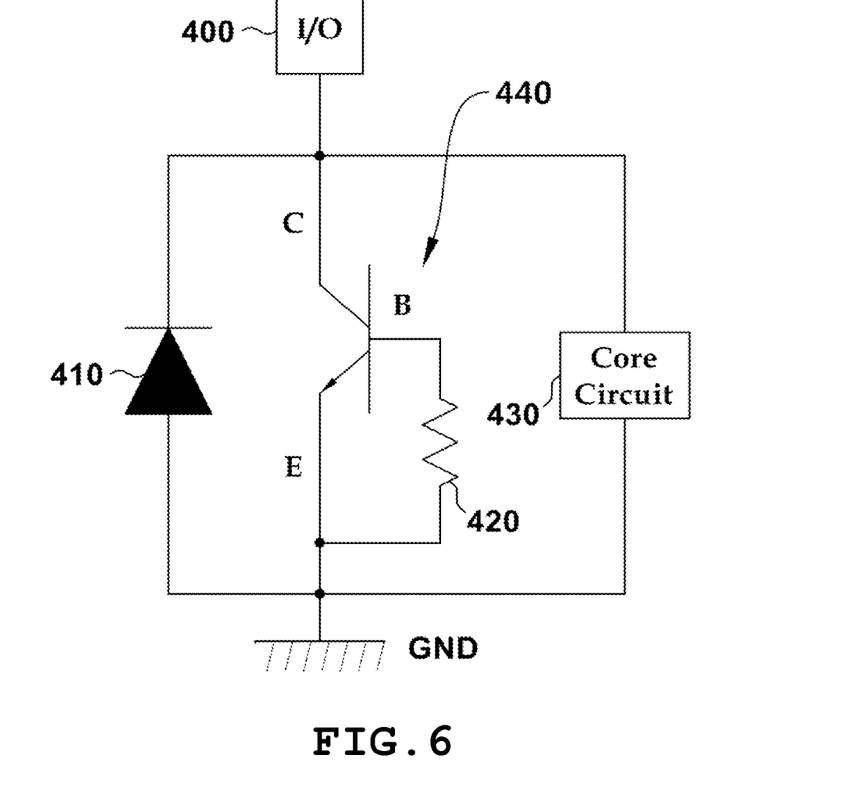
FIG. 6 is a diagram illustrating yet another example of an electrostatic protection circuit.

FIG. 6 is a circuit diagram illustrating an example of an electrostatic protection circuit that includes the ESD transistor according to FIGS. 2A and 2B.

Referring to FIG. 6, an example of an electrostatic protection circuit is an electrostatic protection circuit combined with an ESD transistor for high voltage applications that include a collector, a base, and emitter electrodes C, B, and E in an I/O pad 400. The collector electrode C is connected to the I/O pad 400, the emitter electrode E is connected to a ground electrode GND, and a resistor 420 is connected between the P+ tap region 316 and the base electrode B. A diode 410 is connected between the ground electrode E and the collector electrode C, and the resistor 420 and the diode 410 are connected in parallel.

A core circuit 430 connected in parallel with the ESD transistor 440 for high voltage applications is further included, and the diode 410 is connected in parallel with the ESD transistor 440 for high voltage and the core circuit 430. The diode 410 is connected in the opposite direction to the collector electrode C. The ESD transistor 440 for high voltage may be a BJT.

In one example, because the specific diode 410 is disposed in parallel with the resistor 420 in the ESD protection circuit, more stable ESD protection circuit can be provided.

Figure 7:
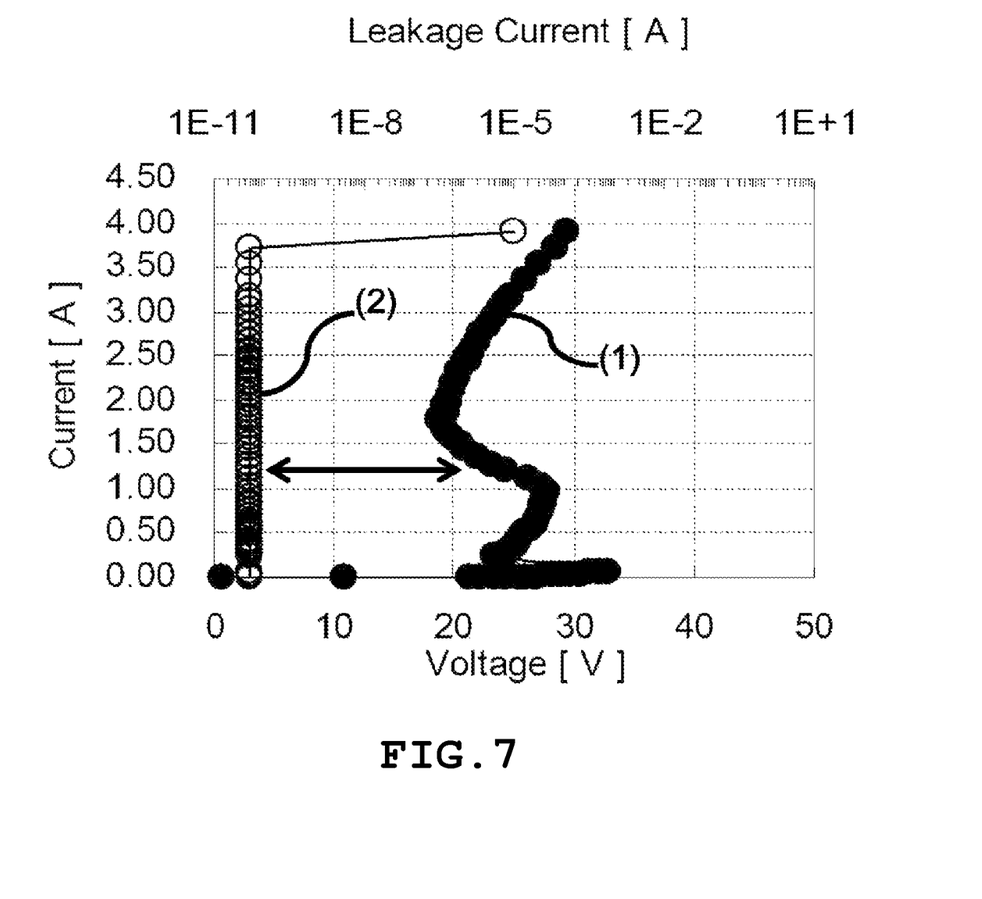
FIG. 7 is a graph illustrating an I-V curve that corresponds to TLP stress pulse features of an example of an ESD transistor when positive ESD stress flows into a collector electrode of the ESD transistor.

FIG. 7 is a graph illustrating a TLP curve illustrating the response of an ESD protection device to positive ESD stress flowing into a collector electrode of an ESD transistor for high voltage applications. Curve 1 corresponds to an I-V curve of a Device Under Test (DUT) structure with increasing input stress voltage. The input stress voltage is applied to the DUT structure at a regular interval, for example, 100 ns. The DUT structure is the ESD protection device according to the present disclosure.

Curve 2 corresponds to leakage current measured at reverse voltage after applying each ESD stress level. Based on Curve 2, it can be checked whether the device is operating normally. The high stress voltage can be applied to the device until the device functionally fails. If the ESD protection device fails, the leakage current can abruptly increase.

In the example illustrated in FIG. 6, in an event that a bipolar junction is formed by adding the resistor 420 made of poly-silicon or metal, a stable BJT feature can be achieved when positive stress is applied to the collector C, as illustrated in FIG. 7. The resistor 420 serves to adjust the potential between the base B and the emitter E. That is, the resistor 420 induces faster turn-on of the ESD transistor by increasing the potential of the base. Accordingly, it is possible to achieve a stable BJT feature in response to positive stress being applied to the collector C.

However, when negative stress is applied, the BJT is turned on in the opposite direction in the order of the emitter E, the base B, and the collector C, such that a failure is easily generated even at low voltage level due to the thin bonding of the emitter E.

Accordingly, it is possible to reduce the ESD stress immunity level by individually using the resistor 420, and the specific diode 410 may be disposed in parallel with the external resistor 420, as in the illustrated example of the ESD protection circuit, such that the circuit may provide more stable ESD protection. The diode 410 is provided for securing a stable BJT feature when stress is applied to the ground region, allowing the stress in the ground region to move out to the I/O pad through the forward PN diode 410. The stress cannot move out through the ESD device, because the ESD transistor is a BJT. Thus, an additional diode may be used for relieving the stress.

Because a diode is disposed in parallel with a resistor outside the ESD transistor for high voltage, as described above, it is possible to prevent the deterioration of the diode by using the diode features.

In various examples of the ESD protection circuit provided above, an ESD transistor for high voltage applications is provided that may reduce its clamping voltage and shunt high-level ESD current by forming an extended current path through the ESD transistor.

The ESD transistor may be capable of rapidly responding to an ESD event by performing partial counter-doping on a base contact region.

Further, it is possible to prevent the deterioration of the diode while using the diode features by disposing a resistor and a diode in parallel outside the ESD transistor.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An ESD transistor comprising:
a collector region on a substrate;
a base contact region on the substrate;
an emitter region spaced apart from the base contact region;
a sink region disposed vertically below the collector region; and
a buried layer disposed under the sink region,
wherein the ESD transistor is configured so that stress applied passes the collector region, the buried layer, and the emitter region in that order.

2. The ESD transistor of claim 1, wherein the buried layer horizontally extends under both the sink region and the emitter region.

3. The ESD transistor of claim 1, wherein the base contact region comprises one or more counter-doping regions doped with a dopant of a conductivity type different from a dopant of the base contact region.

4. The ESD transistor of claim 1, further comprising a tap region disposed adjacent to the collector region.

5. The ESD transistor of claim 4, further comprising an N-well region disposed between the tap region and the buried layer.

6. The ESD transistor of claim 5, further comprising a P-well region disposed in contact with the N-well region under the tap region.

7. The ESD transistor of claim 6, further comprising a diode comprising the P-well and the N-well.

8. The ESD transistor of claim 1, further comprising:
a first insulating film disposed between the emitter region and the base contact region; and
a second insulating film disposed between the base contact region and the collector region.

9. The ESD transistor of claim 1, further comprising a base region surrounding the emitter region and the base contact region.

10. The ESD transistor of claim 9, wherein a horizontal distance between the base region and the sink region is larger than the vertical distance between the base region and the buried layer.

11. The ESD transistor of claim 9, wherein the base region further comprises at least one additional doping region surrounding the base region.

12. The ESD transistor of claim 9, wherein a horizontal distance of the second insulator film is larger than the vertical distance between the base region and the buried layer.

13. The ESD transistor of claim 1, wherein the collector region, the base contact region, and the emitter region each comprises corners.

14. The ESD transistor of claim 1, further comprising a resistor connected between an emitter electrode disposed on the emitter region and a base electrode disposed on the base contact region.

15. The ESD transistor of claim 1, wherein the ESD transistor is a bipolar junction transistor.

16. An ESD transistor comprising:
a collector region on a substrate;
a base contact region on the substrate;
an emitter region spaced apart from the base contact region;
a sink region disposed vertically below the collector region; and
a buried layer disposed under the sink region,
wherein at least two collector regions, base contact regions, and sink regions are respectively symmetrically disposed at both sides of the emitter region, and
the buried layer extends to connect the lower ends of the two sink regions at both sides of the emitter region.

17. An ESD transistor comprising:
an N-type well disposed on a substrate;
a P-well disposed in contact with the N-well;
a collector region, a base region, and an emitter region disposed on a surface of the substrate;
a resistor connecting the emitter region and the base region; and
a diode connecting the P-type well and the N-type well.

18. The ESD transistor of claim 17, wherein the resistor comprises poly-silicon.

19. The ESD transistor of claim 17, further comprising a buried layer connected with the collector region.

20. The ESD transistor of claim 19, wherein the ESD transistor is configured so that stress applied passes the collector region, the buried layer, and the emitter region in that order.

21. An ESD transistor comprising:
a collector region on a substrate;
a base contact region on the substrate;
an emitter region spaced apart from the base contact region;
a sink region disposed vertically below the collector region;
a base region disposed vertically below the base contact region, the base region and the base contact region having a same conductivity type; and
a buried layer disposed under the sink region,
wherein the sink region and the base region have substantially the same depth.

* * * * *